(12) United States Patent
Luong

(10) Patent No.: US 8,389,416 B2
(45) Date of Patent: Mar. 5, 2013

(54) PROCESS FOR ETCHING SILICON WITH SELECTIVITY TO SILICON-GERMANIUM

(75) Inventor: Vinh Hoang Luong, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 184 days.

(21) Appl. No.: 12/951,691

(22) Filed: Nov. 22, 2010

(65) Prior Publication Data

US 2012/0129354 A1    May 24, 2012

(51) Int. Cl.
*H01L 21/302* (2006.01)
*H01L 21/461* (2006.01)
(52) U.S. Cl. ........................................ 438/714; 438/710
(58) Field of Classification Search ........................ None
See application file for complete search history.

(56) References Cited

U.S. PATENT DOCUMENTS

| | | | |
|---|---|---|---|
| 2003/0049893 A1* | 3/2003 | Currie et al. | 438/172 |
| 2005/0133476 A1 | 6/2005 | Islam et al. | |
| 2007/0155025 A1 | 7/2007 | Zhang et al. | |
| 2007/0287238 A1 | 12/2007 | Cho et al. | |
| 2008/0014689 A1 | 1/2008 | Cleavelin et al. | |
| 2008/0135949 A1 | 6/2008 | Lo et al. | |
| 2008/0142853 A1* | 6/2008 | Orlowski | 257/287 |
| 2008/0248642 A1 | 10/2008 | Crowder et al. | |
| 2008/0254577 A1* | 10/2008 | Zhang et al. | 438/156 |
| 2009/0266809 A1* | 10/2009 | Ohata | 219/494 |
| 2009/0267067 A1* | 10/2009 | Jinbo et al. | 257/57 |
| 2010/0193770 A1 | 8/2010 | Bangsaruntip et al. | |

* cited by examiner

*Primary Examiner* — Shamim Ahmed
*Assistant Examiner* — Bradford Gates
(74) *Attorney, Agent, or Firm* — Wood, Herron & Evans, LLP

(57) ABSTRACT

A method for performing a selective etching process is described. The method includes preparing a substrate having a silicon layer (Si) and a silicon-germanium ($SiGe_x$) layer, and selectively etching the silicon layer relative to the silicon-germanium layer using a dry plasma etching process.

18 Claims, 18 Drawing Sheets

| Time | Oxygen dependency for HBr/He process | | |
|---|---|---|---|
| | No O$_2$ | 5 sccm O$_2$ | 250 sccm O$_2$ |
| 10min | | | |
| X-SEM | 130nm | 130nm | 130nm |
| | Pressure = 150 mTorr<br>Power = 700W/0W<br>Flow rate = 666 sccm HBr<br>Flow rate = 333 sccm He<br>No O$_2$<br>Si/SiGe ~ 2.5 | 150 mTorr<br>700W/0W<br>666 sccm HBr<br>333 sccm He<br>5 sccm O$_2$<br>Si/SiGe ~ NA | 150 mTorr<br>700W/0W<br>666 sccm HBr<br>333 sccm He<br>250 sccm O$_2$<br>Si/SiGe ~ NA |

FIG. 13

| Time | Nitrogen dependency for HBr/He process | |
|---|---|---|
| 10min | No N₂ | 100 sccm N₂ |
| X-SEM | 150nm | 150nm |
| | Pressure = 150 mTorr<br>Power = 700W/0W<br>Flow rate = 666 sccm HBr<br>Flow rate = 333 sccm He<br>No N₂<br>Si/SiGe ~ 2.5 | 150 mTorr<br>700W/0W<br>666 sccm HBr<br>333 sccm He<br>100 sccm N₂<br>Si/SiGe ~ NA |

FIG. 14

| Time | Pressure dependency for HBr/He process | |
|---|---|---|
| 10min | 150 mTorr | 350 mTorr |
| X-SEM | ![150nm] | ![150nm] |
| | Pressure = 150mTorr<br>Power = 700W/0W<br>Flow rate = 666 sccm HBr<br>Flow rate = 333 sccm He<br>Si/SiGe ~ 2.5 | 350 mTorr<br>700W/0W<br>666 sccm HBr<br>333 sccm He<br>Si/SiGe ~ NA |

FIG. 15

PROCESS FOR ETCHING SILICON WITH SELECTIVITY TO SILICON-GERMANIUM

BACKGROUND OF THE INVENTION

1. Field of Invention

The present invention relates to a method for performing a selective etching process, and more particularly to a method of selectively etching a silicon layer relative to a silicon-germanium layer using a dry plasma etching process.

2. Description of Related Art

Typically, during fabrication of integrated circuits (ICs), semiconductor production equipment utilize a (dry) plasma etching process to remove or etch material along fine lines or within vias or contacts patterned on a semiconductor substrate. The success of the plasma etching process requires an etching chemistry that includes chemical reactants suitable for selectively etching one material while substantially not etching another material.

For example, on a semiconductor substrate, a pattern formed in a protective layer can be transferred to an underlying layer of a selected material utilizing a plasma etching process. The protective layer can comprise a light-sensitive layer, such as a photoresist layer, having a pattern formed using a lithographic process.

Once the pattern is formed, the semiconductor substrate is disposed within a plasma processing chamber, and an etching chemistry is formed that selectively etches the underlying layer while minimally etching the protective layer. This etch chemistry is produced by introducing an ionizable, dissociative gas mixture having parent molecules comprising molecular constituents capable of reacting with the underlying layer while minimally reacting with the protective layer. The production of the etch chemistry comprises introduction of the gas mixture and formation of plasma when a portion of the gas species present are ionized following a collision with an energetic electron. Moreover, the heated electrons serve to dissociate some species of the gas mixture and create a reactive mixture of chemical constituents (of the parent molecules).

Thereafter, the ionized gas species and reactive mixture of chemical constituents facilitate the etching of various features (e.g., trenches, vias, contacts, etc.) in the exposed regions of the semiconductor substrate. Such substrate materials where etching is required include silicon oxide ($SiO_x$), silicon nitride ($SiN_y$), poly-crystalline silicon (polysilicon), and mono-crystalline silicon (silicon), and doped and undoped silicon, for example.

In some etch applications, it is necessary to etch silicon-germanium with selectivity to silicon and, in other etch applications, it is necessary to etch silicon with selectivity to silicon-germanium. While dry plasma etching processes have been successfully developed to achieve etch selectivity in the former situation, dry plasma etching processes have been unsuccessful in the latter situation. As a result, users have turned to wet etching techniques to selectively etch silicon relative to silicon-germanium.

SUMMARY OF THE INVENTION

According to one embodiment, a method for performing a selective etching process is described. The method includes preparing a substrate having a silicon layer (Si) and a silicon-germanium ($SiGe_x$) layer, and selectively etching an exposed surface of the silicon layer relative to an exposed surface of the silicon-germanium layer using a dry plasma etching process. The method further comprises using a dry plasma etching process having a process composition containing as incipient ingredients HBr and an optional noble gas.

According to another embodiment, method for preparing a silicon-germanium nano-wire is described. The method comprises preparing a film stack on a substrate having alternating layers of silicon (Si) and silicon-germanium ($SiGe_x$), transferring a pattern through a silicon (Si) layer in the alternating layers of silicon (Si) and silicon-germanium ($SiGe_x$) to expose a sidewall of the silicon (Si) layer, transferring a pattern through a silicon-germanium ($SiGe_x$) layer in the alternating layers of silicon (Si) and silicon-germanium ($SiGe_x$) to expose a sidewall of the silicon-germanium ($SiGe_x$) layer, and laterally etching the sidewall of the silicon (Si) layer by exposing the film stack to a dry plasma etching process having a process composition containing as incipient ingredients HBr and optionally He. Furthermore, the dry plasma etching process achieves an etch selectivity between the silicon (Si) layer and the silicon-germanium ($SiGe_x$) layer greater than unity.

BRIEF DESCRIPTION OF THE DRAWINGS

In the accompanying drawings:

FIG. 13 provides a SEM photograph of an etch result using a plasma etching process;

FIG. 14 provides a SEM photograph of another etch result using a plasma etching process; and FIG. 15 provides a SEM photograph of yet another etch result using a plasma etching process.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

In material processing methodologies, dry plasma etching utilizes a plasma chemistry having chemical reactants suitable for selectively etching one material while substantially not etching another material. As described earlier, in some etch applications, it is necessary to etch silicon with selectivity to silicon-germanium or germanium. However, dry plasma etching processes have been unsuccessful in achieving a higher etch rate for silicon relative to silicon-germanium, hence, users have been relegated to wet etching solutions. In one example to be discussed in greater detail below, it is desirable to etch silicon at a greater rate than silicon-germanium when forming silicon-germanium nano-wires for advanced transistors.

Figure 1:
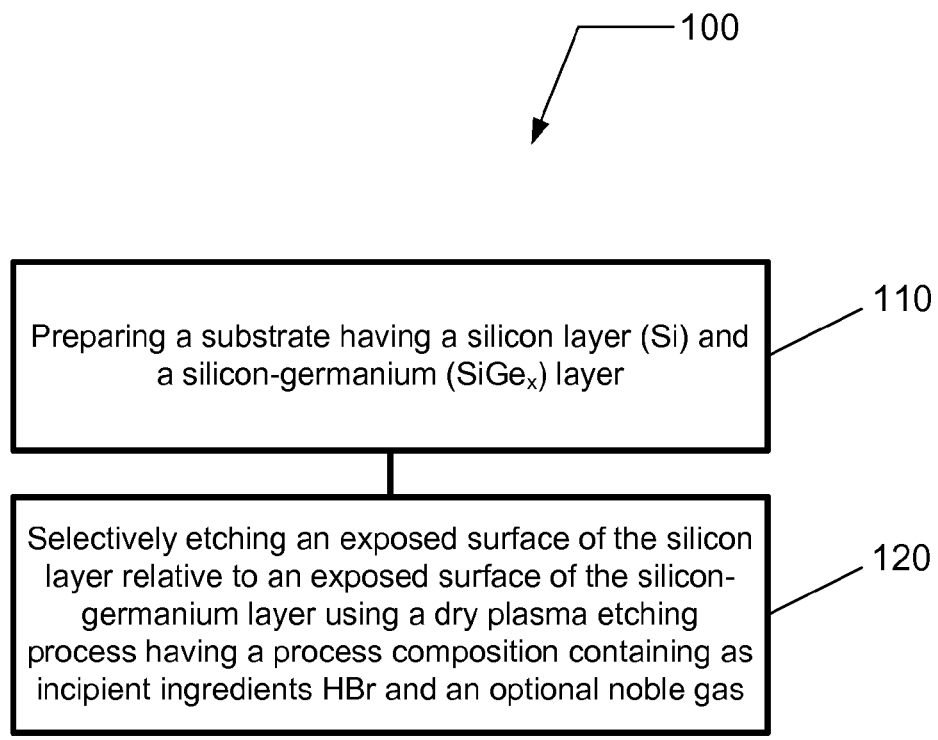
FIG. 1 provides a flow chart illustrating a method of selectively etching a substrate according to an embodiment.

Therefore, in accordance with an embodiment of the invention, a method for performing a selective etching process is illustrated in FIG. 1. The method is represented by a flow chart 100 beginning in 110 with preparing a substrate having a silicon (Si) layer and a silicon-germanium (SiGe$_x$) layer, wherein x represents a real number greater than 0. Alternatively, the substrate may be prepared having a silicon (Si) layer and a silicon-germanium-carbon (SiGe$_x$C$_y$) layer, wherein x and y are real numbers greater than 0. Alternatively yet, the substrate may be prepared having a silicon (Si) layer and a germanium (Ge) layer.

Then, in 120, an exposed surface of the silicon layer is etched relative to an exposed surface of the silicon-germanium layer, the silicon-germanium-carbon layer, or the germanium layer, using a dry plasma etching process. In one embodiment, the dry plasma etching process facilitates anisotropic etching of the silicon layer relative to the silicon-germanium layer, the silicon-germanium-carbon layer, or the germanium layer. And, in another embodiment, the dry plasma etching process facilitates isotropic etching of the silicon layer relative to the silicon-germanium layer, the silicon-germanium-carbon layer, or the germanium layer.

The dry plasma etching process comprises a process composition containing as incipient ingredients HBr and an optional noble gas (i.e., He, Ne, Ar, Kr, Xe). Alternatively, the process composition contains HBr and He. Alternatively yet, the process composition consists of HBr and He. As will be discussed further below, the inventors have discovered that an etch selectivity between the silicon layer and the silicon-germanium layer may be achieved in excess of 2-to-1 (or 2:1) (the aforementioned etch selectivity represents the ratio of the etch rate for silicon divided by the etch rate for silicon-germanium).

To achieve the aforementioned etch selectivity, a flow rate of HBr gas may be selected to range from about 1 sccm (standard cubic centimeters per minute) to about 2000 sccm, e.g., 500 sccm to about 1000 sccm, and a flow rate of the optional noble gas may be selected to range from about 1 sccm to about 1000 sccm, e.g., 100 sccm to about 500 sccm. The pressure in the plasma etching system is selected to range up to 1000 mTorr (milli-Torr), or up to 200 mTorr, e.g., 50 mTorr to 200 mTorr, or 100 mTorr to 200 mTorr.

A ratio between a flow rate of HBr and a flow rate of He may range from about 1:1 to about 10:1. Alternatively, a ratio between a flow rate of HBr and a flow rate of He may range from about 1:1 to about 4:1. Alternatively yet, a ratio between a flow rate of HBr and a flow rate of He may range from about 1.5:1 to about 2.5:1. Optionally, the process composition may further contain an additive gas, such as a halogen-containing gas, a fluorocarbon-containing gas, a hydrocarbon-containing gas, $O_2$, $N_2$, $H_2$, CO, $CO_2$, NO, $NO_2$, $N_2O$, or $NH_3$, or any combination of two or more thereof.

The method may further comprise adjusting one or more process parameters in the dry plasma etching process to change a polarity of an etch selectivity between the silicon layer and the silicon-germanium layer, the silicon-germanium-carbon layer, or the germanium layer. Herein, the phrase "polarity of the etch selectivity" between, for example, the silicon layer and the silicon-germanium layer is used to denote a change in the etch selectivity relative to unity. When the etch selectivity exceeds unity, the silicon layer is etched at a rate greater than the rate the silicon-germanium layer is etched (i.e., positive polarity of the etch selectivity), and when the etch selectivity is less than unity, the silicon layer is etched at a rate less than the rate the silicon-germanium layer is etched (i.e., negative polarity of the etch selectivity). The one or more process parameters may include a pressure, a power, a HBr flow rate, a He flow rate, a flow rate of an additive gas, or a temperature, or any combination of two or more thereof.

As will be described in greater detail below, the substrate temperature may be controlled according to a temperature control scheme using a temperature controlled substrate holder in the plasma etching system. Using the temperature controlled substrate holder in the plasma etching system, the substrate temperature may be spatially and temporally controlled to improve the dry plasma etching process.

The temperature controlled substrate holder may comprise a support base having fluid channels to circulate a temperature controlled thermal fluid in the support base, and a substrate support coupled via a thermal insulator to an upper portion of the support base. The substrate support further comprises one or more heating elements embedded within the substrate support, an upper surface to support the substrate by contact between the upper surface and a backside of the substrate, and an electrostatic clamp electrode to hold the substrate on the upper surface of the substrate support. The one or more heating elements may comprise a first heating element located at a substantially central region of the substrate and a second heating element located at a substantially edge region of the substrate, wherein the first heating element and the second heating element are concentrically arranged.

Additionally, the temperature controlled substrate holder may include a backside gas supply system configured to supply a heat transfer gas to the backside of the substrate through at least one of a plurality of orifices or channels disposed on the upper surface of the substrate support. The orifices of the backside gas supply system may be arranged in a plurality of zones on the upper surface of the substrate support to vary a backside pressure in a radial direction between a substantially central region of the backside of the substrate and a substantially edge region of the backside of the substrate. For example, the plurality of zones for controlling the supply of heat transfer gas to the backside of the substrate may correspond to the regions where the first and second heating elements are located.

The process pressure may be varied during the dry plasma etching process. Additionally, during the dry plasma etching process, power for generating plasma may be varied, or it may be kept constant. Furthermore, the dry plasma etching process may proceed for a time duration determined in-situ using endpoint detection or ex-situ prior to performing each dry plasma etching process. To address etch uniformity, etch profile control, and/or critical dimension (CD) control, the duration of the dry plasma etching process may be extended by an over-etch process.

Figure 2:
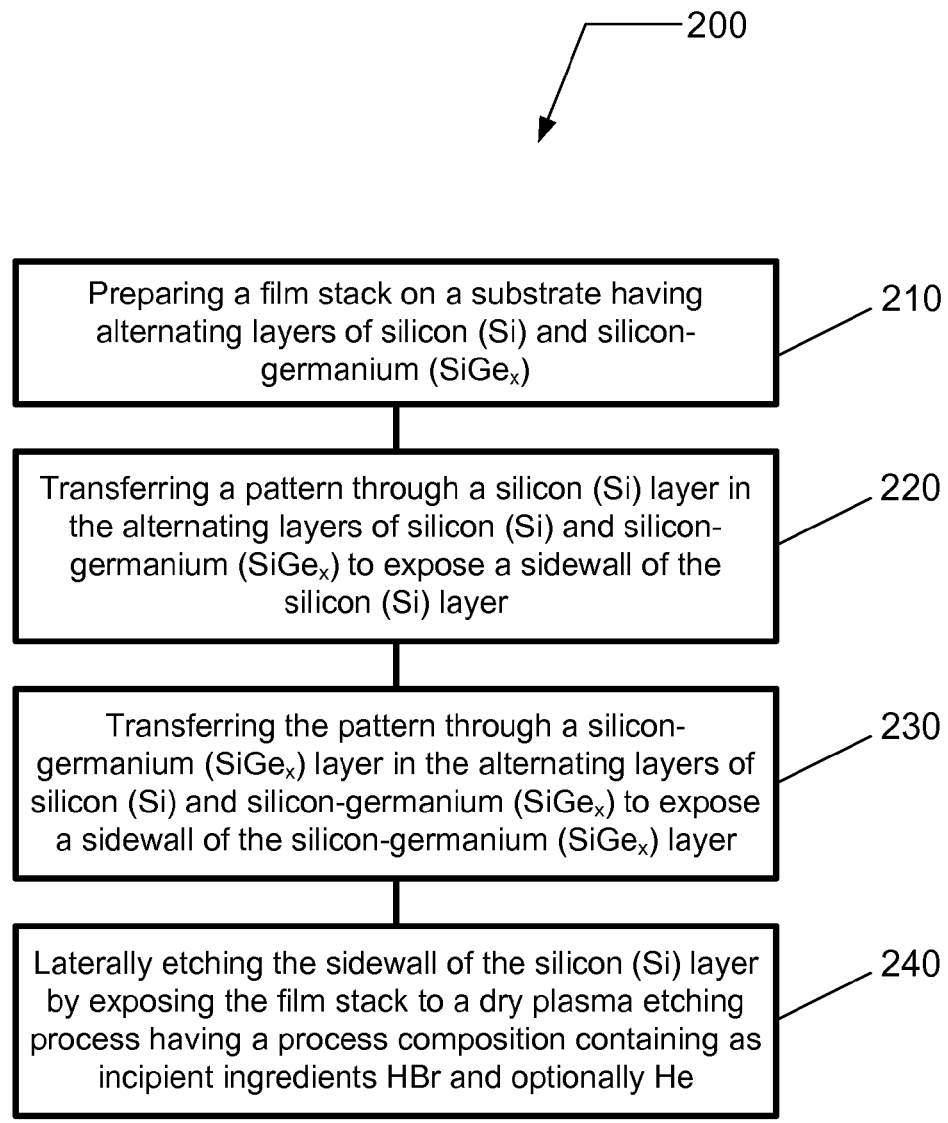
FIG. 2 provides a flow chart illustrating a method for preparing a nano-wire according to another embodiment.
Figure 3A:
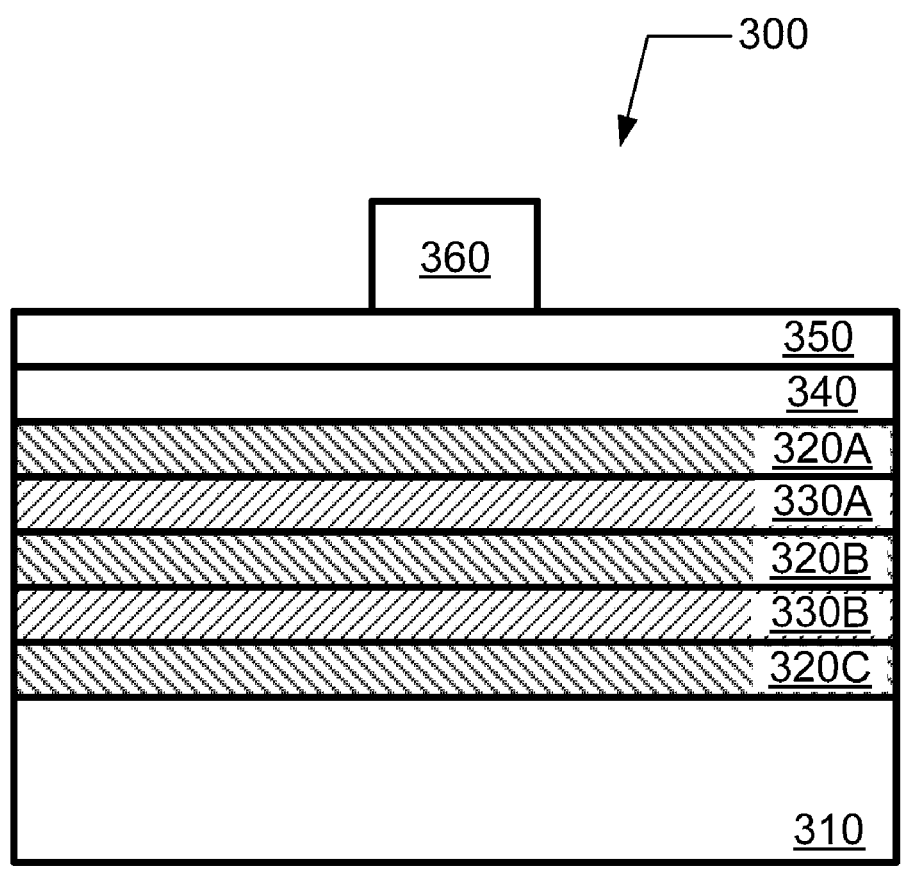
FIGS. 3A and 3F show a schematic representation of a method for preparing a nano-wire according to another embodiment.

Referring now to FIGS. 2 and 3A through 3F, a method for preparing a silicon-germanium nano-wire is illustrated according to another embodiment of the invention. Robust nano-wire fabrication is essential for nano-wire-based MOSFET (metal-oxide-semiconductor field-effect transistor) design. As shown in FIGS. 2 and 3A, the method is represented by a flow chart 200 beginning in 210 with preparing a film stack 300 on a substrate 310 having alternating layers of silicon (Si) (320A, 320B, 320C) and silicon-germanium ($SiGe_x$) (330A, 330B), wherein x is a real number greater than 0. Alternatively, the layers of silicon-germanium ($SiGe_x$) (330A, 330B) may be Ge layers. The film stack 300 may further include one or more mask layers (340, 350). For example, a first mask layer 340 may include silicon oxide, such as $SiO_2$, and a second mask layer 350 may include silicon nitride, such as $Si_3N_4$. Furthermore, the film stack 300 includes a layer of light-sensitive material 360, such as photoresist, that is patterned using lithographic techniques.

Figure 3B:
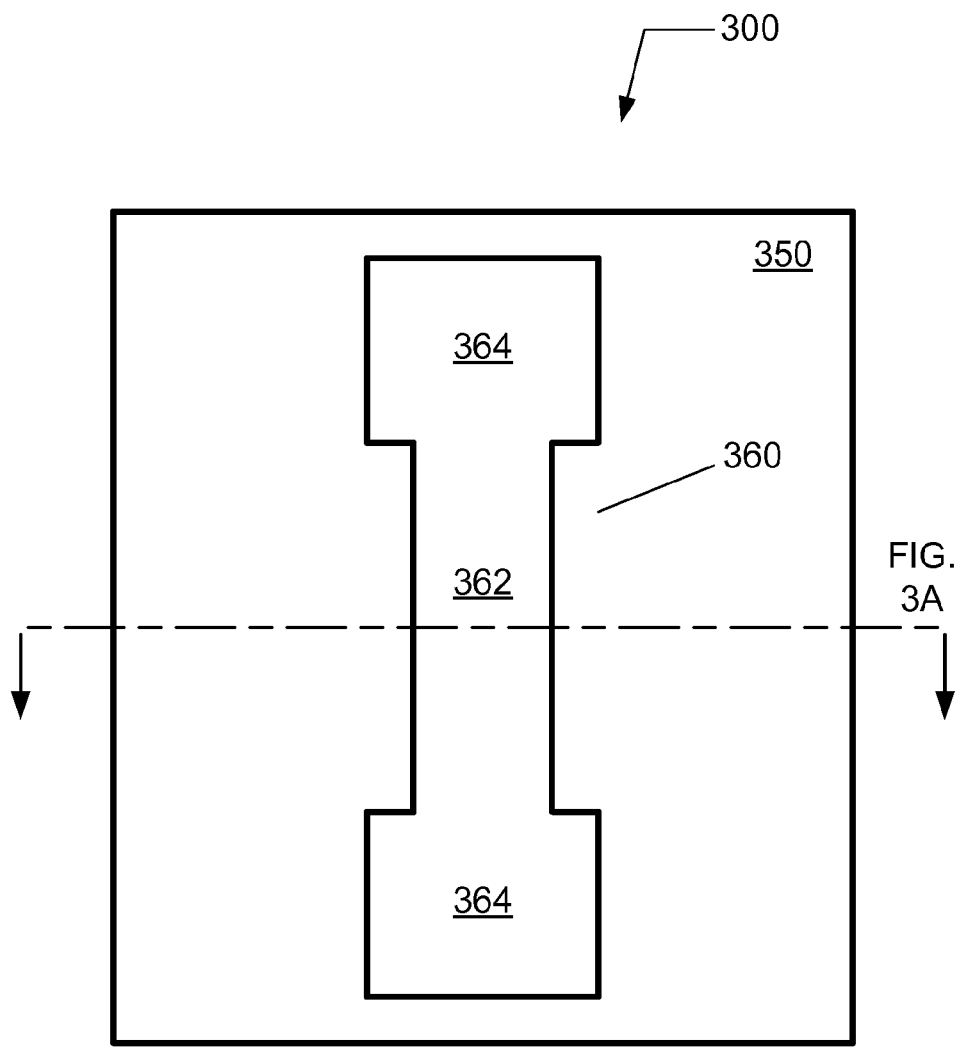
Figure 3C:
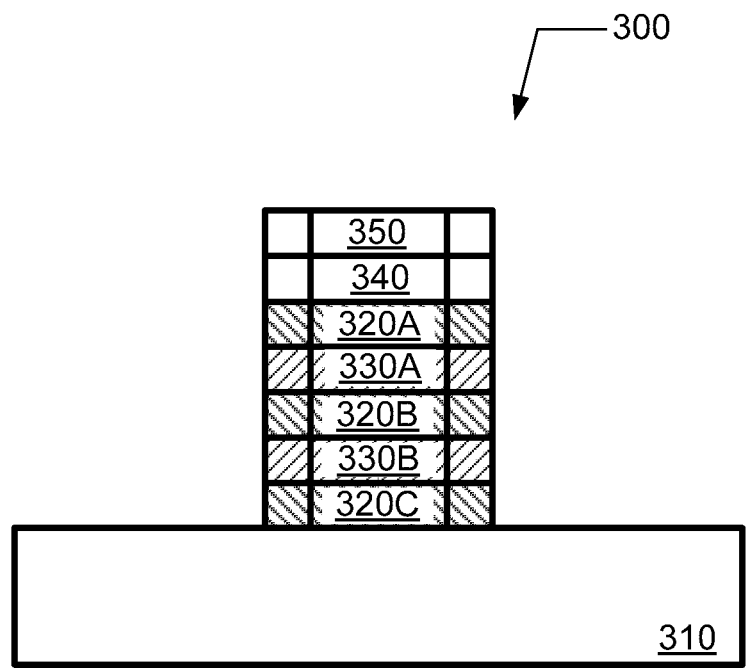

As shown in FIG. 3B, a top view is provided of a pattern formed in the layer of light-sensitive material 360. The pattern may include a fin pattern 362 extending between opposing buttress patterns 364 located at distal ends of the fin pattern 362. As shown in FIGS. 2 and 3C, the pattern, including the fin pattern 362 and the buttress patterns 364, is transferred through the one or more mask layers (340, 350). Additionally, as shown in FIGS. 2 and 3C, in 220, the pattern, including the fin pattern 362 and the buttress patterns 364, is transferred through at least one silicon (Si) layer (320A, 320B, 320C) in the alternating layers of silicon (Si) and silicon-germanium ($SiGe_x$) to expose a sidewall of the at least one silicon (Si) layer (320A, 320B, 320C). Furthermore, as shown in FIGS. 2 and 3C, in 230, the pattern, including the fin pattern 362 and the buttress patterns 364, is transferred through at least one silicon-germanium ($SiGe_x$) layer (330A, 330B) in the alternating layers of silicon (Si) and silicon-germanium ($SiGe_x$) to expose a sidewall of the at least one silicon-germanium ($SiGe_x$) layer (330A, 330B).

The pattern transfer process may include one or more etching processes. The one or more etching processes may include one or more dry etching processes, such as one or more dry plasma etching processes. The one or more dry etching processes may include plasma formed using a process composition containing as incipient ingredients a halogen-containing gas, such as HBr, HCl, $Cl_2$, $Br_2$, $SF_6$, $NF_3$, $BCl_3$, etc., a fluorocarbon gas, such as $CF_4$, $C_3F_8$, $C_4F_6$, $C_4F_8$, $C_5F_8$, etc., a fluorohydrocarbon gas, such as $CH_3F$, $CHF_3$, $CH_2F_2$, etc., an oxygen-containing gas, a nitrogen-containing gas, a hydrogen-containing gas, a noble gas, etc.

Figure 3D:
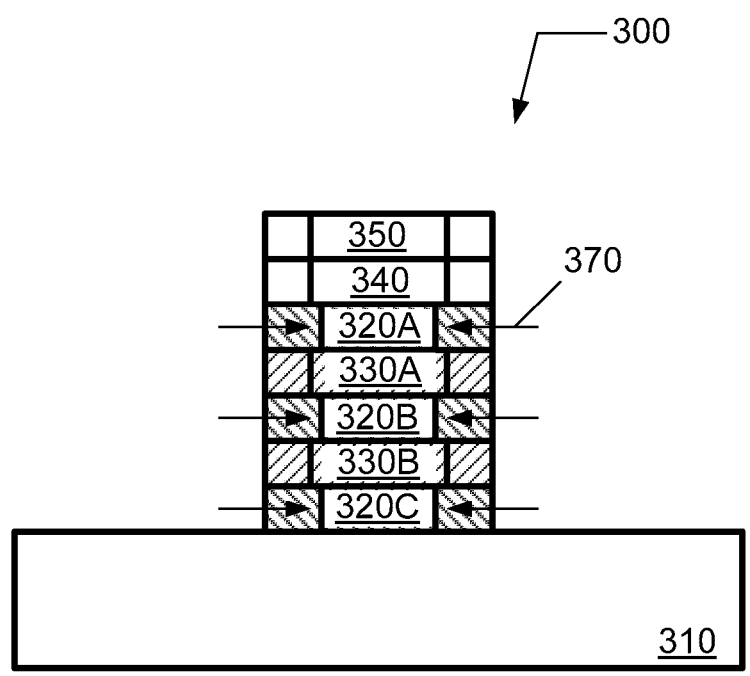

As shown in FIGS. 2 and 3D, in 230, the sidewall of at least one silicon (Si) layer (320A, 320B, 320C) is laterally etched (in a lateral direction 370) by exposing the film stack 300 to a dry plasma etching process. The dry plasma etching process facilitates an isotropic etching process using plasma formed from a process composition containing as incipient ingredients HBr and optionally a noble gas (i.e., He, Ne, Ar, Kr, Xe) using process conditions set forth above. Furthermore, the dry plasma etching process achieves an etch selectivity between the silicon (Si) layer (320A, 320B, 320C) and the silicon-germanium ($SiGe_x$) layer (330A, 330B) that is greater than unity.

Alternatively, the process composition contains HBr and He. Alternatively yet, the process composition consists of HBr and He. As will be discussed further below, the inventors have discovered that an etch selectivity between the silicon layer (320A, 320B, 320C) and the silicon-germanium layer (330A, 330B) may be achieved in excess of 2-to-1 (or 2:1) for an HBr/He-based dry plasma etching process.

As shown in FIGS. 3C and 3D, the pattern, including the fin pattern 362 and the buttress patterns 364, extends through all of the alternating layers of silicon (Si) and silicon-germanium ($SiGe_x$), and the sidewall of each of the silicon (Si) layers is laterally etched. However, in an alternate embodiment, the pattern, including the fin pattern 362 and the buttress patterns 364, may partially extend through the alternating layers of silicon (Si) and silicon-germanium ($SiGe_x$), and the sidewall of the exposed silicon (Si) layers is laterally etched.

Figure 3E:
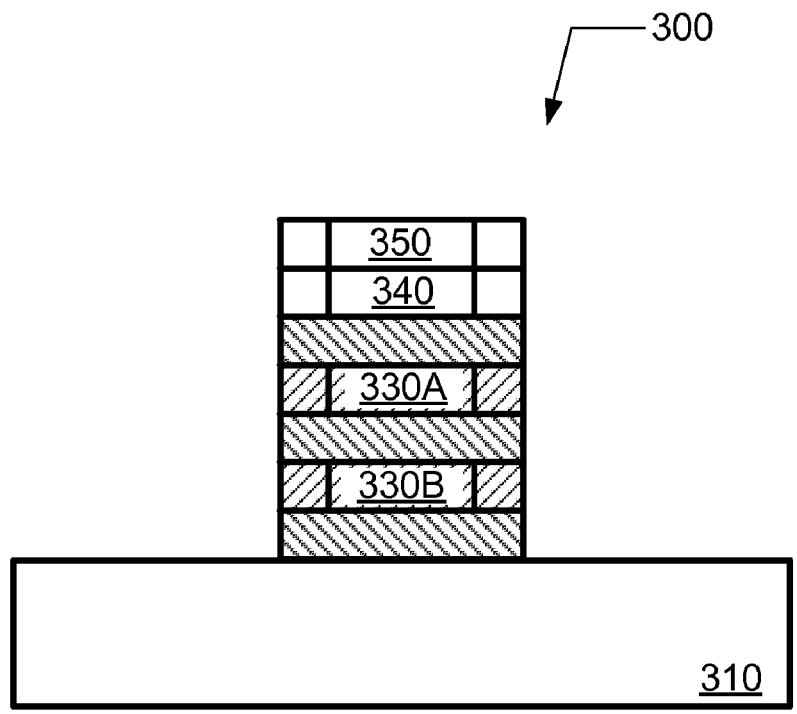
Figure 3F:
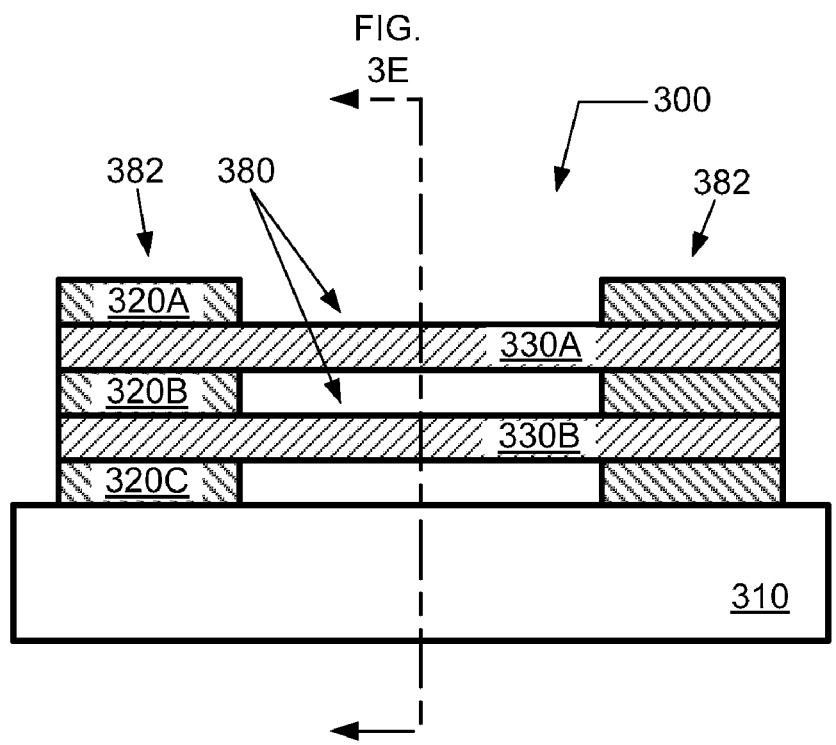

As shown in FIGS. 3E and 3F, the dry plasma etching process may proceed, laterally etching at least one silicon (Si) layer (320A, 320B, 320C), until the at least one silicon (Si) layer (320A, 320B, 320C) is removed from the fin pattern formed in the film stack 300 and at least one silicon-germanium ($SiGe_x$) layer bridge 380 is released and extending between buttress structures 382. The at least one silicon-germanium ($SiGe_x$) layer bridge 380 may serve as part of a single bridge or multi-bridge channel in a nano-wire-based MOSFET.

As shown in FIG. 3F, the one or more mask layers (340, 350) may be removed. The removal of the one or more mask layers (340, 350) may be performed using wet and/or dry (etch) processing. Among other things, during the transfer of the pattern, including the fin pattern 362 and the buttress patterns 364, to the alternating layers of silicon (Si) and silicon-germanium ($SiGe_x$), the one or more mask layers (340, 350) may serve to protect nano-wire fabrication towards an upper portion of the film stack 300 relative to nano-wire fabrication towards a lower portion of the film stack 300. In doing so, a more uniform array of nano-wires may be manufactured.

The dry plasma etching process described above may be performed utilizing a plasma etching system such as the one described in FIGS. 4 through 11. Furthermore, the dry plasma etching process described above may be performed utilizing a temperature controlled substrate holder in a plasma etching system such as the one described in FIG. 12.

Figure 4:
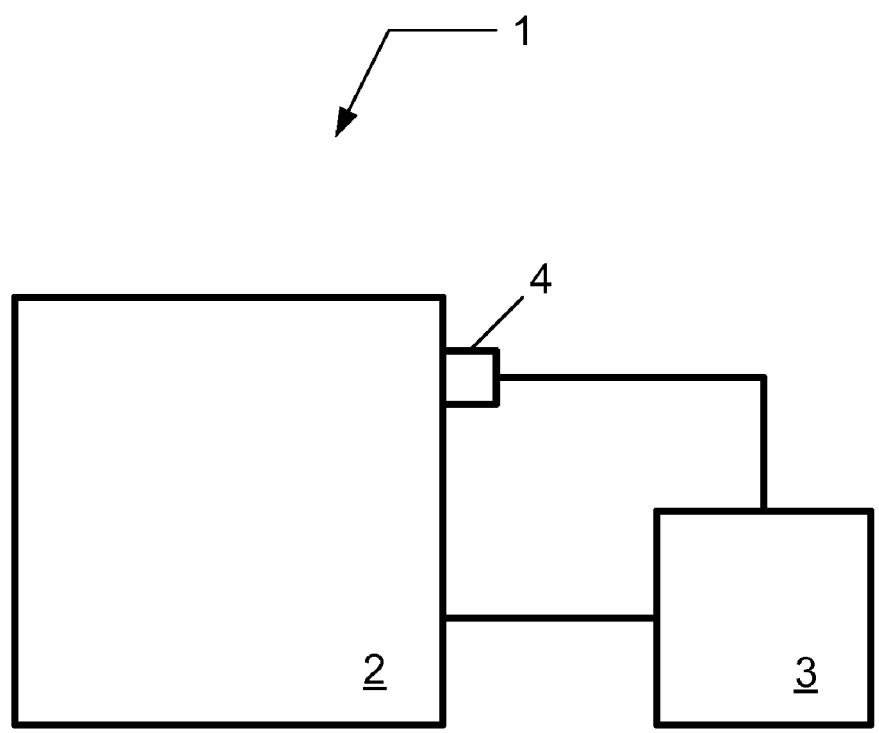
FIG. 4 shows a schematic representation of a plasma etching system according to an embodiment.

According to one embodiment, a plasma etching system 1 is depicted in FIG. 4 comprising a plasma processing chamber 2, a diagnostic system 3 coupled to the plasma processing chamber 2, and a controller 4 coupled to the diagnostic system 3 and the plasma processing chamber 2.

The controller 4 is configured to execute a process recipe comprising a process gas composition having as incipient ingredients a process gas containing HBr and an optional noble gas, such as He. Alternatively, the controller 4 is configured to execute a process recipe comprising HBr and He to selectively etch silicon relative to silicon-germanium. Additionally, controller 4 is configured to receive at least one endpoint signal from the diagnostic system 3 and to post-process the at least one endpoint signal in order to accurately determine an endpoint for the dry plasma etching process. In the illustrated embodiment, plasma etching system 1, depicted in FIG. 4, utilizes plasma for material processing.

Figure 5:
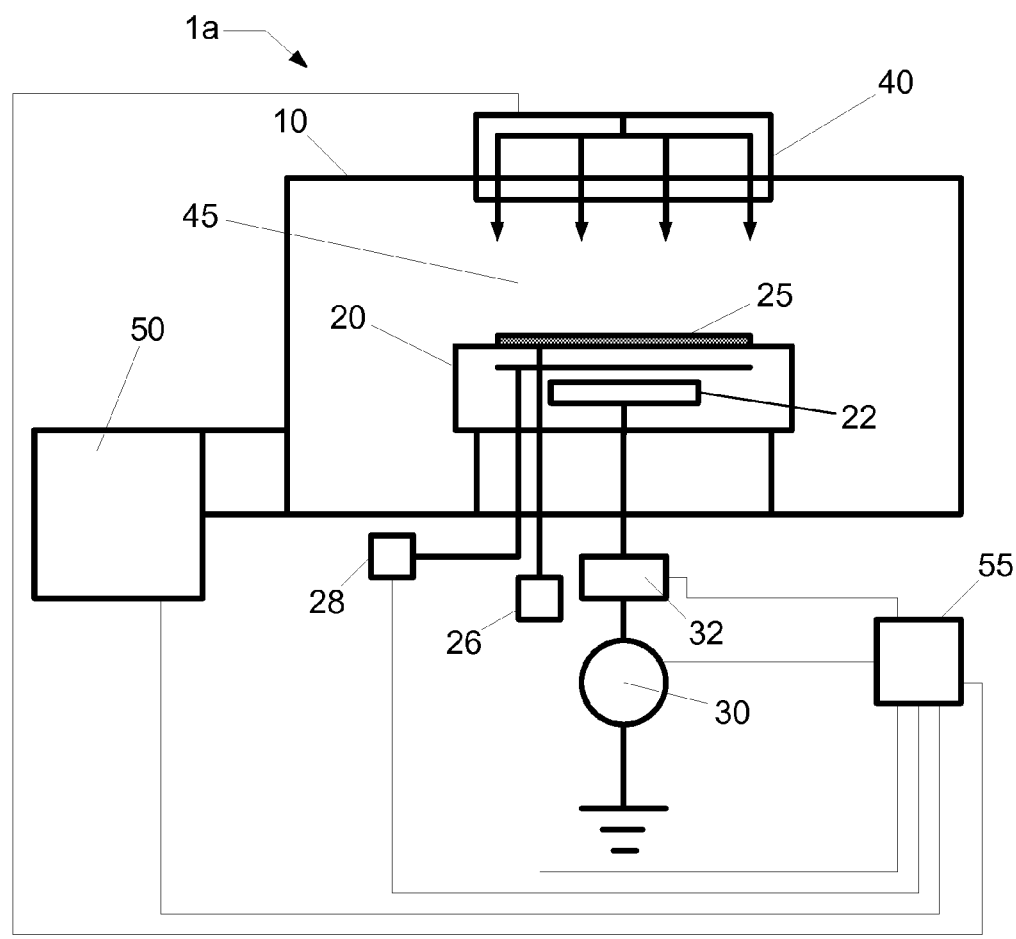
FIG. 5 shows a schematic representation of a plasma etching system according to another embodiment.

According to another embodiment, a plasma etching system 1a configured to perform the above identified process conditions is depicted in FIG. 5 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma etching system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma etching system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 5, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10.

Controller 55 comprises a microprocessor, memory, and a digital I/O port capable of generating control voltages sufficient to communicate and activate inputs to plasma etching system 1a as well as monitor outputs from plasma etching system 1a. Moreover, controller 55 can be coupled to and can exchange information with RF generator 30, impedance match network 32, the gas distribution system 40, vacuum pumping system 50, as well as the substrate heating/cooling system (not shown), the backside gas supply system 26, and/or the electrostatic clamping system 28. For example, a program stored in the memory can be utilized to activate the inputs to the aforementioned components of plasma etching system 1a according to a process recipe in order to perform a plasma assisted process on substrate 25.

Controller 55 can be locally located relative to the plasma etching system 1a, or it can be remotely located relative to the plasma etching system 1a. For example, controller 55 can exchange data with plasma etching system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 6, plasma etching system 1b can be similar to the embodiment of FIG. 5 and further comprise either a stationary, or mechanically or electrically rotating magnetic field system 60, in order to potentially increase plasma density and/or improve plasma processing uniformity, in addition to those components described with reference to FIG. 5. Moreover, controller 55 can be coupled to magnetic field system 60 in order to regulate the speed of rotation and field strength. The design and implementation of a rotating magnetic field is well known to those skilled in the art.

Figure 6:
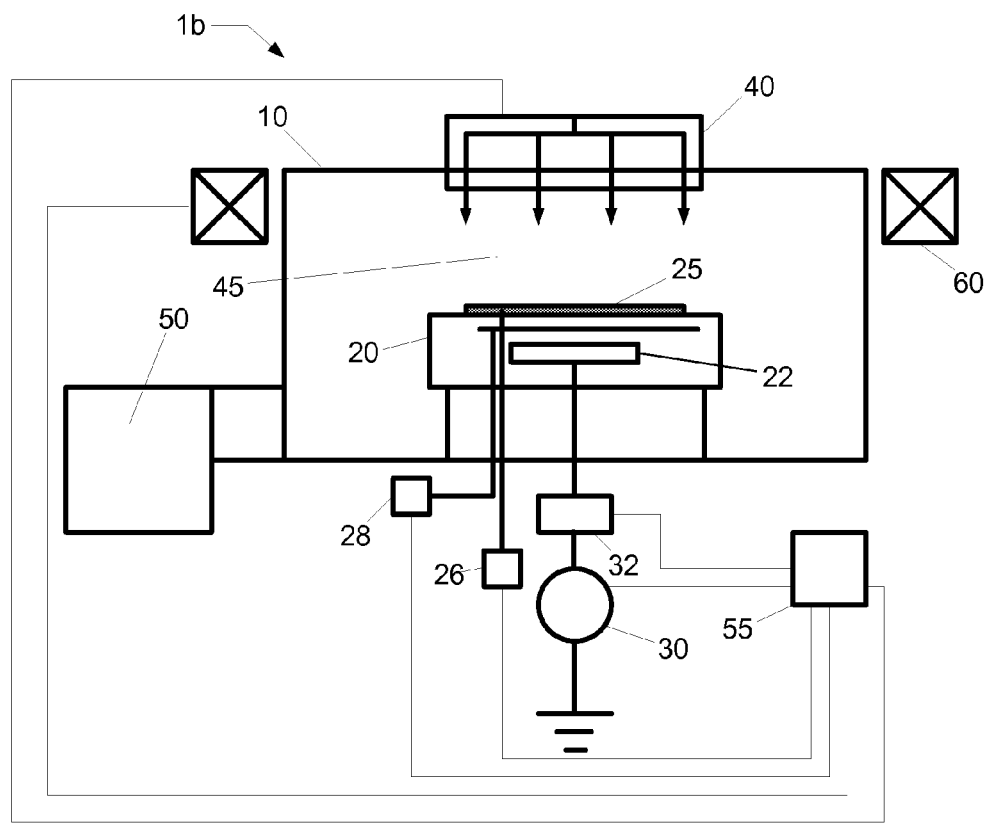
FIG. 6 shows a schematic representation of a plasma etching system according to another embodiment.
Figure 7:
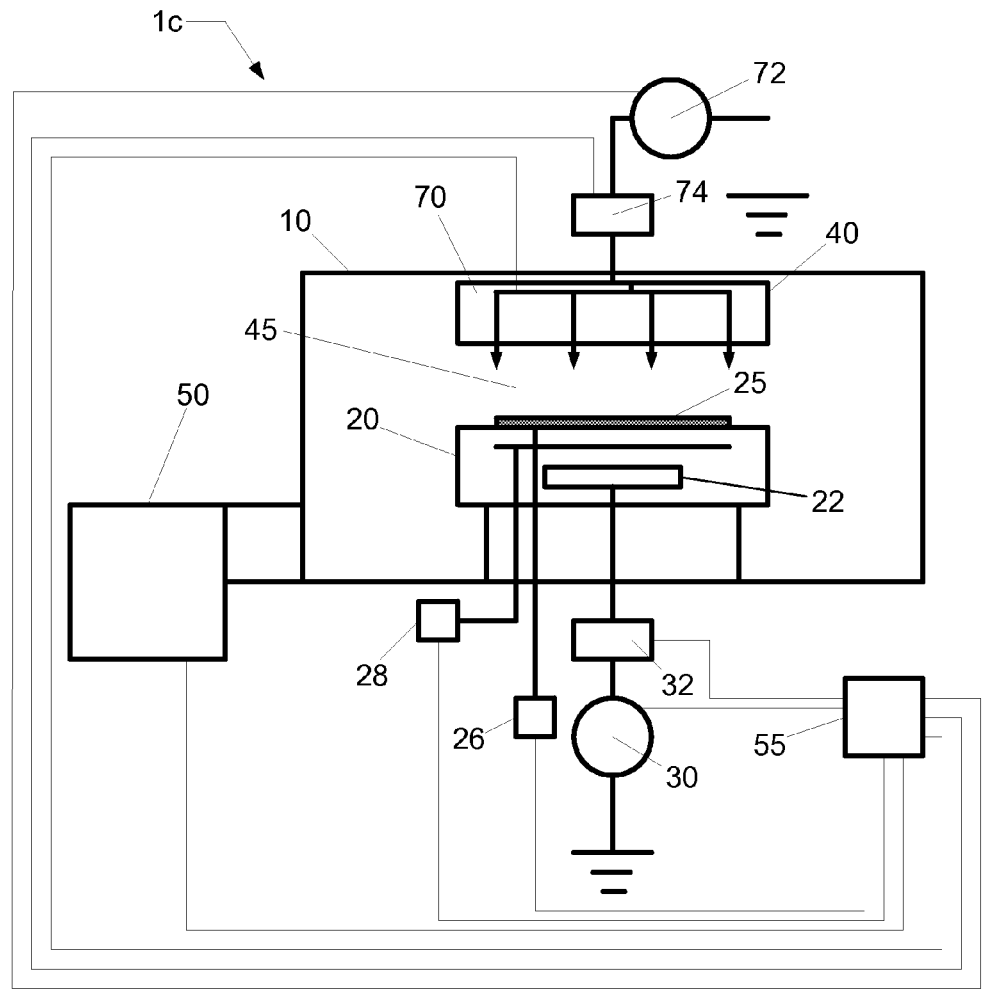
FIG. 7 shows a schematic representation of a plasma etching system according to another embodiment.

In the embodiment shown in FIG. 7, plasma etching system 1c can be similar to the embodiment of FIG. 5 or FIG. 6, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 8:
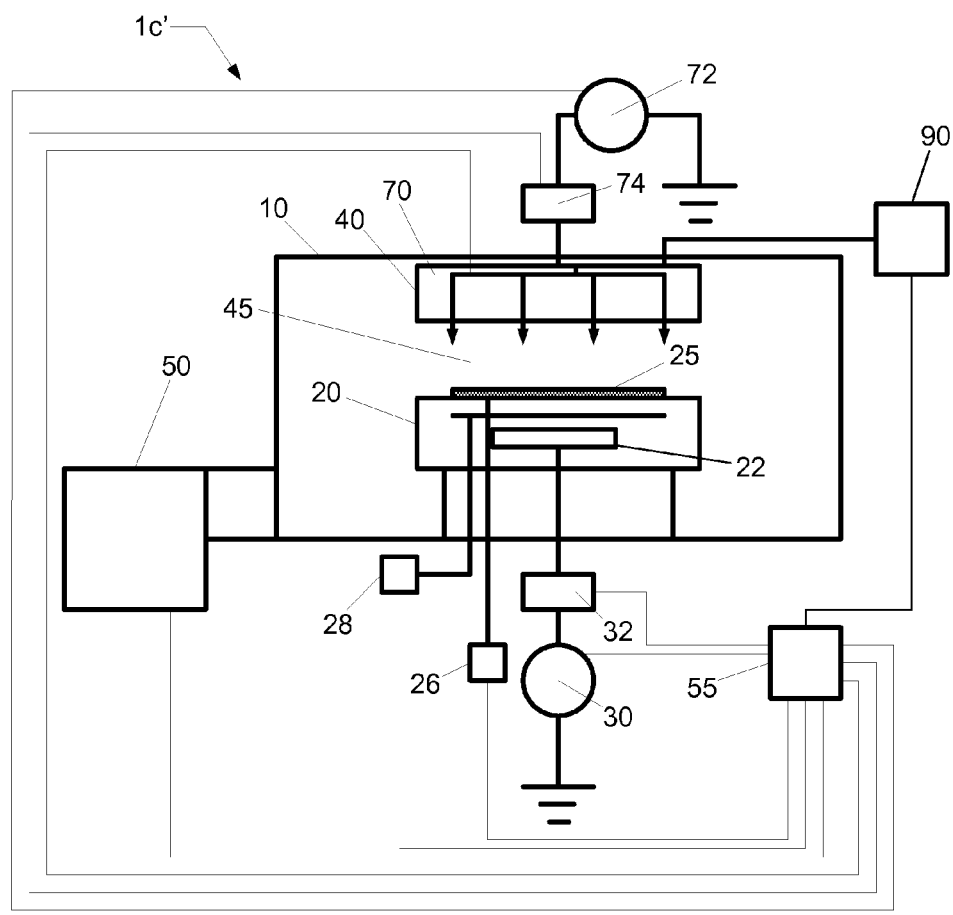
FIG. 8 shows a schematic representation of a plasma etching system according to another embodiment.

In the embodiment shown in FIG. 8, plasma etching system 1c' can be similar to the embodiment of FIG. 7, and can further comprise a direct current (DC) power supply 90 coupled to the upper electrode 70 opposing the substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 9:
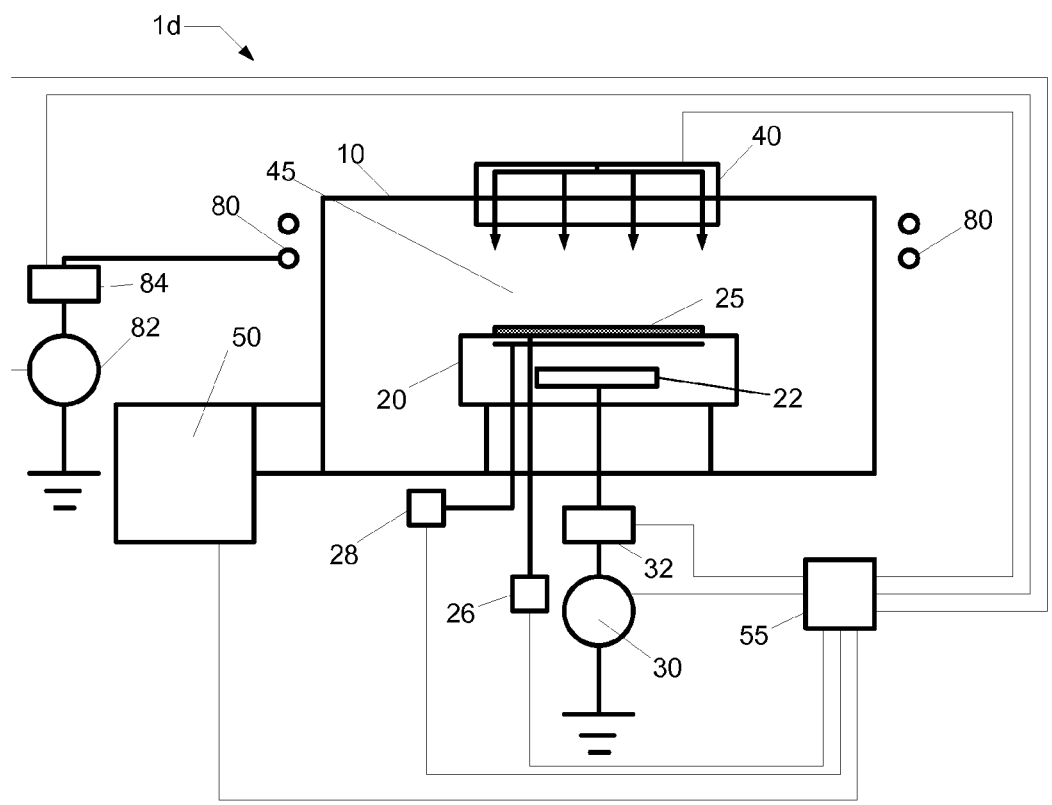
FIG. 9 shows a schematic representation of a plasma etching system according to another embodiment.

In the embodiment shown in FIG. 9, plasma etching system 1d can be similar to the embodiments of FIGS. 5 and 6, and can comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 10:
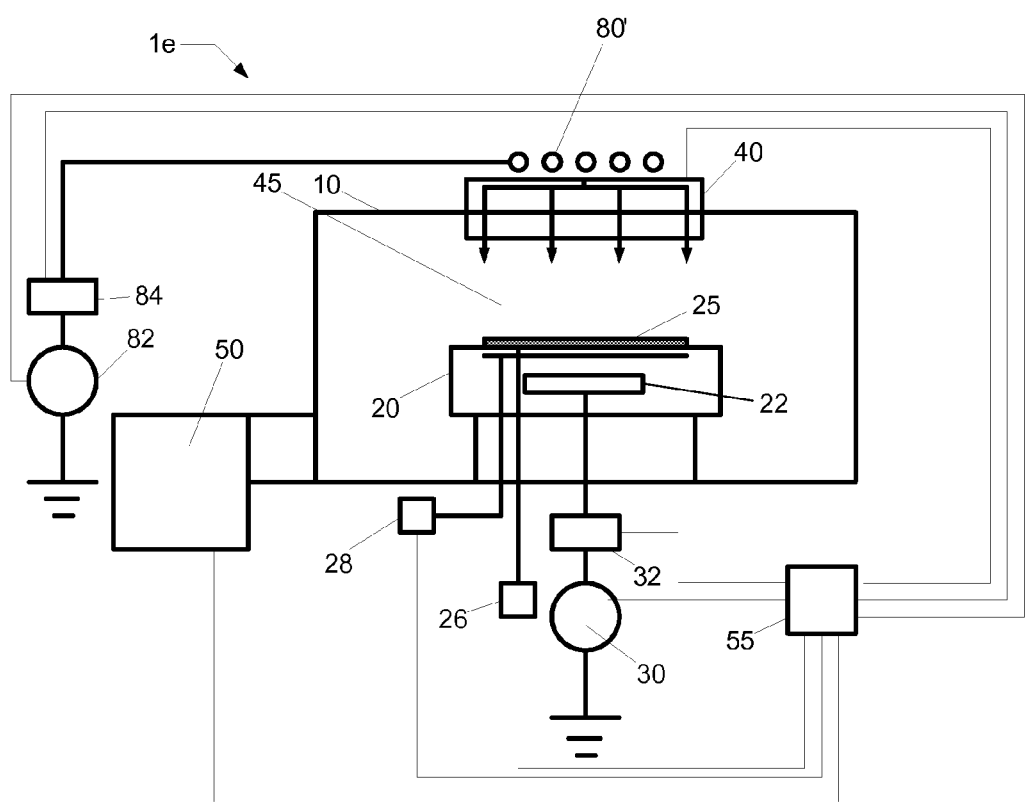
FIG. 10 shows a schematic representation of a plasma etching system according to another embodiment.

In an alternate embodiment, as shown in FIG. 10, plasma etching system 1e can be similar to the embodiment of FIG. 9, and can comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
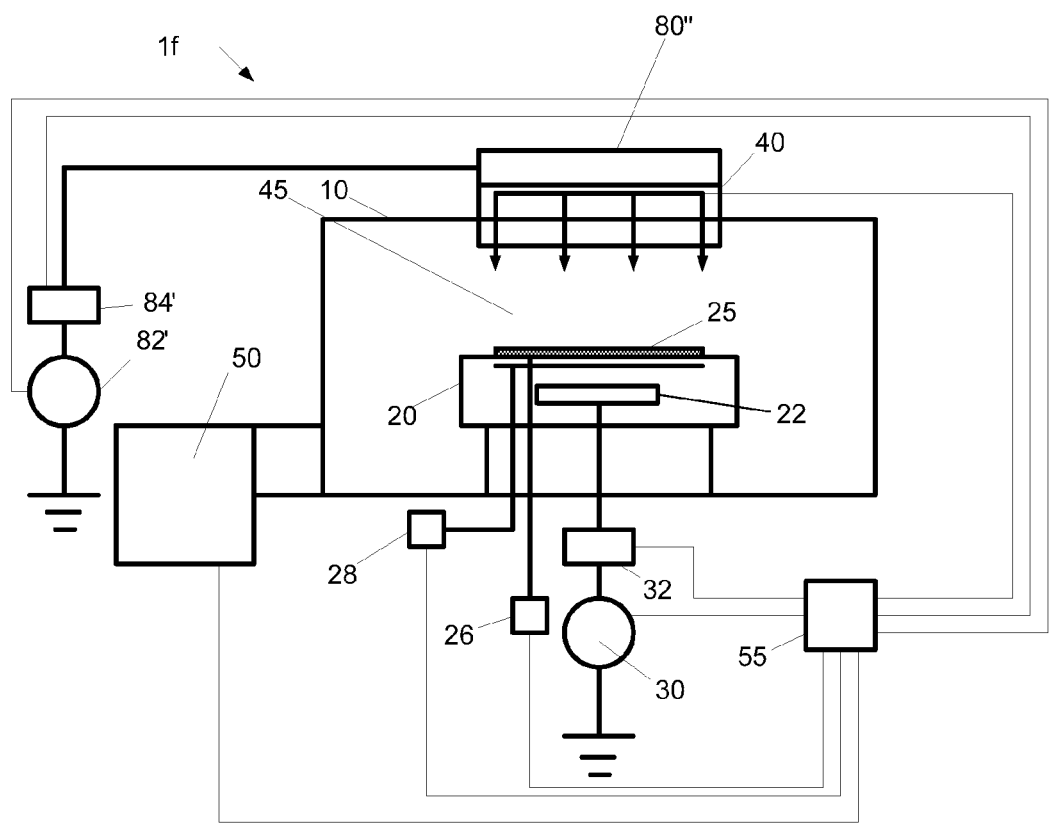
FIG. 11 shows a schematic representation of a plasma etching system according to another embodiment.

In the embodiment shown in FIG. 11, plasma etching system if can be similar to the embodiment of FIG. 5, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

Figure 12:
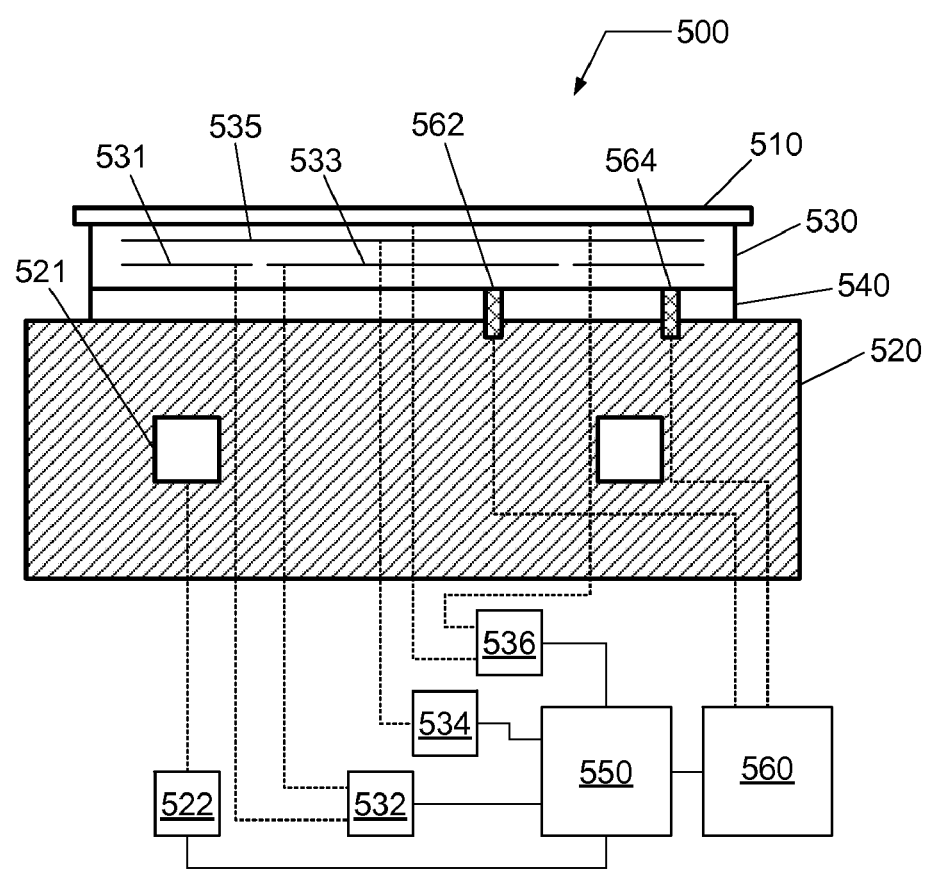
FIG. 12 shows a schematic representation of a substrate holder for use in a plasma etching system according to yet another embodiment.

Referring now to FIG. 12, a temperature controlled substrate holder 500 for use in any one of the plasma etching systems depicted in FIGS. 4 through 11 is described according to yet another embodiment. The substrate holder 500 comprises a substrate support 530 having a first temperature and configured to support a substrate 510, a temperature-controlled support base 520 positioned below substrate support 530 and configured to be at a second temperature less than the first temperature (e.g., less than a desired temperature of substrate 510), and a thermal insulator 540 disposed between the substrate support 530 and the temperature-controlled support base 520. Additionally, the substrate support 530 comprises a center heating element 533 (located at a substantially center region below substrate 510) and an edge heating element 531 (located at a substantially edge, or peripheral, region below substrate 510) coupled thereto, and configured to elevate the temperature of the substrate support 530. Furthermore, the support base 520 comprises one or more cooling elements 521 coupled thereto, and configured to reduce the temperature of the substrate support 530 via the removal of heat from the substrate support 530 through thermal insulator 540.

As shown in FIG. 12, the center heating element 533 and the edge heating element 531 are coupled to a heating element control unit 532. Heating element control unit 532 is configured to provide either dependent or independent control of each heating element, and exchange information with a controller 550. The center heating element 533 and the edge heating element 531 may comprise at least one of a heating fluid channel, a resistive heating element, or a thermo-electric element biased to transfer heat towards the wafer.

For example, the center heating element 533 and the edge heating element 531 may comprise one or more heating channels that can permit flow of a fluid, such as water, FLUORINERT, GALDEN HT-135, etc., there through in order to provide conductive-convective heating, wherein the fluid temperature has been elevated via a heat exchanger. The fluid flow rate and fluid temperature can, for example, be set, monitored, adjusted, and controlled by the heating element control unit 532.

Alternatively, for example, the center heating element 533 and the edge heating element 531 may comprise one or more resistive heating elements such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). For example, the heating elements can comprise a cast-in heater commercially available from Watlow (1310 Kingsland Dr., Batavia, Ill., 60510) capable of a maximum operating temperature of 400 to 450 degrees C., or a film heater comprising aluminum nitride materials that is also commercially available from Watlow and capable of operating temperatures as high as 300 degrees C. and power densities of up to 23.25 W/cm$^2$. Additionally, for example, the heating element can comprise a silicone rubber heater (1.0 mm thick) capable of 1400 W (or power density of 5 W/in$^2$). When an electrical current flows through the filament, power is dissipated as heat, and, therefore, the heating element control unit 532 can, for example, comprise a controllable DC power supply. A further heater option, suitable for lower temperatures and power densities, are Kapton heaters, consisting of a filament embedded in a Kapton (e.g. polyimide) sheet, marketed by Minco, Inc., of Minneapolis, Minn.

Alternately, for example, the center heating element 533 and the edge heating element 531 can comprise an array of thermo-electric elements capable of heating or cooling a substrate depending upon the direction of electrical current flow through the respective elements. Thus, while the center heating element 533 and the edge heating element 531 are referred to as "heating elements," these elements may include the capability of cooling in order to provide rapid transition between temperatures. Further, heating and cooling functions may be provided by separate elements within the substrate support 530. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the heating element control unit 532 can, for example, comprise a controllable current source.

The one or more cooling elements 521 can comprise at least one of a cooling channel, or a thermo-electric element. Furthermore, as shown in FIG. 12, the one or more cooling elements 521 are coupled to a cooling element control unit 522. Cooling element control unit 522 is configured to provide dependent or independent control of each cooling element 521, and exchange information with controller 550.

For example, the one or more cooling elements 521 can comprise one or more cooling channels that can permit flow of a fluid, such as water, FLUORINERT, GALDEN HT-135, etc., there through in order to provide conductive-convective cooling, wherein the fluid temperature has been lowered via a heat exchanger. The fluid flow rate and fluid temperature can, for example, be set, monitored, adjusted, and controlled by the cooling element control unit 522. Alternately, during heating for example, the fluid temperature of the fluid flow through the one or more cooling elements 521 may be increased to complement the heating by the center heating element 533 and the edge heating element 531. Alternately yet, during cooling for example, the fluid temperature of the fluid flow through the one or more cooling elements 521 may be decreased.

Alternately, for example, the one or more cooling elements 521 can comprise an array of thermo-electric elements capable of heating or cooling a substrate depending upon the direction of electrical current flow through the respective elements. Thus, while the elements 521 are referred to as "cooling elements," these elements may include the capability of heating in order to provide rapid transition between temperatures. Further, heating and cooling function may be provided by separate elements within the temperature controlled support base 520. An exemplary thermo-electric element is one commercially available from Advanced Thermo-electric, Model ST-127-1.4-8.5M (a 40 mm by 40 mm by 3.4 mm thermo-electric device capable of a maximum heat transfer power of 72 W). Therefore, the cooling element control unit 522 can, for example, comprise a controllable current source.

Additionally, as shown in FIG. 12, the substrate holder 500 may further comprise an electrostatic clamp (ESC) comprising one or more clamping electrodes 535 embedded within substrate support 530. The ESC further comprises a high-voltage (HV) DC voltage supply 534 coupled to the clamping electrodes 535 via an electrical connection. The design and implementation of such a clamp is well known to those skilled in the art of electrostatic clamping systems. Furthermore, the HV DC voltage supply 534 is coupled to controller 550 and is configured to exchange information with controller 550.

Furthermore, as shown in FIG. 12, the substrate holder 500 can further comprise a back-side gas supply system 536 for supplying a heat transfer gas, such as an inert gas including helium, argon, xenon, krypton, a process gas, or other gas including oxygen, nitrogen, or hydrogen, to the center region and the edge region of the backside of substrate 510 through two gas supply lines, and at least two of a plurality of orifices and channels (not shown). The backside gas supply system 536, as shown, comprises a two-zone (center/edge) system, wherein the backside pressure can be varied in a radial direction from the center to edge. Furthermore, the backside gas supply system 536 is coupled to controller 550 and is configured to exchange information with controller 550.

Further yet, as shown in FIG. 12, the substrate holder 500 further comprises a center temperature sensor 562 for measuring a temperature at a substantially center region below substrate 510 and an edge temperature sensor 564 for measuring a temperature at a substantially edge region below substrate 510. The center and edge temperature sensors 562, 564 are coupled to a temperature monitoring system 560.

The temperature sensor can include an optical fiber thermometer, an optical pyrometer, a band-edge temperature measurement system as described in U.S. Pat. No. 6,891,124, the contents of which are incorporated herein by reference in their entirety, or a thermocouple (as indicated by the dashed line) such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

The temperature monitoring system 560 may provide sensor information to controller 550 in order to adjust at least one of a heating element, a cooling element, a backside gas supply system, or an HV DC voltage supply for an ESC before, during, or after processing.

Controller 550 includes a microprocessor, memory, and a digital I/O port (potentially including D/A and/or A/D converters) capable of generating control voltages sufficient to communicate and activate inputs to substrate holder 500 as well as monitor outputs from substrate holder 500. As shown in FIG. 12, controller 550 can be coupled to and exchange information with heating element control unit 532, cooling element control unit 522, HV DC voltage supply 534, backside gas supply system 536, and temperature monitoring system 560. A program stored in the memory is utilized to interact with the aforementioned components of substrate holder 500 according to a stored process recipe.

The controller 550 may also be implemented as a general purpose computer, processor, digital signal processor, etc., which causes a substrate holder to perform a portion or all of the processing steps of the invention in response to the controller 550 executing one or more sequences of one or more instructions contained in a computer readable medium. The computer readable medium or memory is configured to hold instructions programmed according to the teachings of the invention and can contain data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 550 may be locally located relative to the substrate holder 500, or it may be remotely located relative to the substrate holder 500 via an internet or intranet. Thus, controller 550 can exchange data with the substrate holder 500 using at least one of a direct connection, an intranet, or the internet. Controller 550 may be coupled to an intranet at a customer site (i.e., a device maker, etc.), or coupled to an intranet at a vendor site (i.e., an equipment manufacturer). Furthermore, another computer (i.e., controller, server, etc.) can access controller 550 to exchange data via at least one of a direct connection, an intranet, or the internet.

Optionally, substrate holder 500 can include an electrode through which RF power is coupled to plasma in a processing region above substrate 510. For example, support base 520 can be electrically biased at an RF voltage via the transmission of RF power from an RF generator through an impedance match network to substrate holder 500. The RF bias can serve to heat electrons to form and maintain plasma, or bias substrate 510 in order to control ion energy incident on substrate 510, or both. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, an impedance match network can serve to maximize the transfer of RF power to plasma in the processing chamber by minimizing the reflected power. Various match network topologies (e.g., L-type, pi-type, T-type, etc.) and automatic control methods can be utilized.

Additional details for the design of a temperature controlled substrate holder configured for rapid and uniform control of substrate temperature are provided in U.S. Patent Application Publication No. 2008/0083723; U.S. Patent Application Publication No. 2010/0078424; U.S. Patent Application Publication No. 2008/0083724; U.S. Patent Application Publication No. 2008/0073335; U.S. Pat. No. 7,297,894; U.S. Pat. No. 7,557,328; and U.S. Patent Application Publication No. 2009/0266809.

In one embodiment, the dry plasma etching process may comprise a process parameter space that includes: a chamber pressure ranging up to about 1000 mTorr (milli-Torr) (e.g., up to about 200 mTorr, or ranging from about 50 mTorr to about 200 mTorr, or about 100 mTorr to about 200 mTorr), a HBr gas flow rate ranging from about 1 sccm to about 2000 sccm (standard cubic centimeters per minute) (e.g., about 500 sccm to about 1000 sccm), a noble gas flow rate ranging from about 1 sccm to about 1000 sccm (e.g., about 100 sccm to about 500 sccm), an upper electrode (e.g., element 70 in FIG. 8) RF bias ranging up to about 2000 W (watts) (e.g., up to about 1000 W, or up to about 500 W), and a lower electrode (e.g., element 22 in FIG. 8) RF bias ranging up to about 1000 W (e.g., up to about 500 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

As described above, the process composition may further include an additive gas, such as a noble gas. The noble gas may include He.

In one embodiment, RF power is supplied to the upper electrode and the lower electrode. In an alternate embodiment, RF power is supplied to the upper electrode and not the lower electrode. In another alternate embodiment, RF power is supplied to the lower electrode and not the upper electrode. In alternate embodiments, RF power and/or DC power may be coupled in any of the manners described in FIGS. 4 through 11.

The time duration to perform a dry plasma etching process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch, wherein the over-etch period constitutes a fraction (i.e., 1 to 100%) of the time between initiation of the etch process and the time associated with endpoint detection.

The dry plasma etching process described above may be performed utilizing a plasma etching system such as the one described in FIGS. 4 through 11. Furthermore, the dry plasma etching process described above may be performed utilizing a temperature controlled substrate holder in a plasma etching system such as the one described in FIG. 12. However, the methods discussed are not to be limited in scope by this exemplary presentation.

As noted above, the present inventors discovered that a dry plasma etching process having a process composition containing HBr and He may etch silicon at a greater rate than silicon-germanium. Moreover, this etching process may be used to isotropically etch silicon with selectivity to silicon-germanium to release nano-wires for use in advanced electronic devices.

Referring now to FIGS. 13 through 15, exemplary etch data is provided for SiGe nano-wire fabrication in a Si/SiGe film stack. As illustrated in FIG. 3A, film stack 300 includes alternating layers of silicon (Si) (320A, 320B, 320C) and silicon-germanium (SiGe$_x$) (330A, 330B), wherein x is a real number greater than 0. The film stack 300 further includes first mask layer 340 (e.g., SiO$_2$), and second mask layer 350 (e.g., Si$_3$N$_4$). Once the pattern, including the fin pattern 362 and the buttress patterns 364 are extended into the film stack 300, a dry plasma etching process is performed to laterally etch the Si with selectivity to the SiGe to release the SiGe nano-wires.

For each dry plasma etching process, a process condition is recited including an upper electrode (UEL) power (watts, W) (e.g., "Power=700 W/0 W" in FIG. 13, wherein the first power in bold is the UEL power), a lower electrode (LEL) power (watts, W) (e.g., "Power=700 W/0 W" in FIG. 13, wherein the second power in bold is the LEL power), a gas pressure (milli-Torr, mTorr) in the plasma etching system, a HBr flow rate (flow rate in standard cubic centimeters per minute, sccm), a He flow rate (flow rate in sccm), an $O_2$ flow rate (flow rate in sccm), and etch time (min, minutes). Although not recited in FIGS. 13 through 15, the process condition may include a temperature set for components in the plasma etching system (° C.), and a backside helium (He) pressure (Torr).

FIG. 13 provides photographs using cross-sectional scanning electron microscopy (X-SEM) of a sidewall of the fin pattern formed in the film stack 300 following partial, lateral etching of the silicon layer(s) (320A, 320B, 320C). The X-SEM photographs are arranged side-by-side for each of three process conditions, recited beneath each photograph, for an HBr/He-based dry plasma etching process with and without $O_2$ addition. The etch selectivity for Si relative to SiGe (i.e., "Si/SiGe"=Si etch rate/SiGe etch rate) is provided with each photograph. As $O_2$ addition is increased, the etch selectivity (Si/SiGe) diminishes and possibly changes polarity of the etch selectivity from etching Si at a greater rate to etching SiGe at a greater rate. At no $O_2$ addition or low $O_2$ flow rate, the sidewall of the fin structure formed in the alternating layers of Si and SiGe exhibits undulations, wherein the Si layers are etched at a greater rate than SiGe. However, at high $O_2$ flow rate, the sidewall is smooth indicating substantially equivalent etch rates or passivation of the exposed Si and SiGe surfaces.

FIG. 14 provides photographs using cross-sectional scanning electron microscopy (X-SEM) of a sidewall of the fin pattern formed in the film stack 300 following partial, lateral etching of the silicon layer(s) (320A, 320B, 320C). The X-SEM photographs are arranged side-by-side for each of two process conditions, recited beneath each photograph, for an HBr/He-based dry plasma etching process with and without $N_2$ addition. The etch selectivity for Si relative to SiGe (i.e., "Si/SiGe"=Si etch rate/SiGe etch rate) is provided with each photograph. As $N_2$ addition is increased, the etch selectivity (Si/SiGe) diminishes and possibly changes polarity of the etch selectivity from etching Si at a greater rate to etching SiGe at a greater rate. At no $N_2$ addition, the sidewall of the fin structure formed in the alternating layers of Si and SiGe exhibits undulations, wherein the Si layers are etched at a greater rate than SiGe. However, at high $N_2$ flow rate, the sidewall is relatively smooth indicating substantially equivalent etch rates or passivation of the exposed Si and SiGe surfaces.

FIG. 15 provides photographs using cross-sectional scanning electron microscopy (X-SEM) of a sidewall of the fin pattern formed in the film stack 300 following partial, lateral etching of the silicon layer(s) (320A, 320B, 320C). The X-SEM photographs are arranged side-by-side for each of two process conditions, recited beneath each photograph, for an HBr/He-based dry plasma etching process at different process pressure. The etch selectivity for Si relative to SiGe (i.e., "Si/SiGe"=Si etch rate/SiGe etch rate) is provided with each photograph. As the process pressure is increased, the etch selectivity (Si/SiGe) diminishes and possibly changes polarity of the etch selectivity from etching Si at a greater rate to etching SiGe at a greater rate. At relatively low process pressure, the sidewall of the fin structure formed in the alternating layers of Si and SiGe exhibits undulations, wherein the Si layers are etched at a greater rate than SiGe. However, at relatively high process pressure, the sidewall is relatively smooth indicating substantially equivalent etch rates.

Although only certain embodiments of this invention have been described in detail above, those skilled in the art will readily appreciate that many modifications are possible in the embodiments without materially departing from the novel teachings and advantages of this invention. For example, although one exemplary process flow is provided for preparing a nano-wire, other process flows are contemplated. Accordingly, all such modifications are intended to be included within the scope of this invention.

The invention claimed is:

1. A method for performing a selective etching process, comprising:
  preparing a substrate having a silicon layer (Si) and a silicon-germanium (SiGe.sub.x) layer; and
  selectively etching an exposed surface of said silicon layer relative to an exposed surface of said silicon-germanium layer using a dry plasma etching process having a process composition containing as incipient ingredients HBr and an optional noble gas,
  wherein said dry plasma etching process achieves an etch selectivity between said silicon layer and said silicon-germanium layer greater than or equal to 2.

2. The method of claim 1, wherein said process composition consists of HBr and He.

3. The method of claim 1, wherein said process composition further contains as incipient ingredients a halogen-containing gas, a fluorocarbon-containing gas, a hydrocarbon-containing gas, $O_2$, $N_2$, $H_2$, CO, $CO_2$, NO, $NO_2$, $N_2O$, or $NH_3$, or any combination of two or more thereof.

4. The method of claim 1, wherein said dry plasma etching process includes setting a gas pressure in a plasma etching system ranging up to 200 mTorr.

5. The method of claim 1, wherein said dry plasma etching process excludes coupling radio frequency (RF) power to a substrate holder upon which said substrate rests.

6. The method of claim 1, wherein said dry plasma etching process includes optionally coupling first radio frequency (RF) power at a first frequency to a substrate holder upon which said substrate rests in a plasma etching system, and coupling second radio frequency (RF) power at a second frequency to an upper electrode opposing said substrate on said substrate holder.

7. The method of claim 6, wherein said dry plasma etching process excludes coupling said first RF power to said substrate holder.

8. The method of claim 2, wherein a ratio between a flow rate of HBr and a flow rate of He ranges from 1:1 to 4:1.

9. The method of claim 2, wherein a ratio between a flow rate of HBr and a flow rate of He ranges from 1.5:1 to 2.5:1.

10. The method of claim 1, further comprising:
  optionally introducing an additive gas to said process composition; and
  adjusting one or more process parameters in said dry plasma etching process to change a polarity of an etch selectivity between said silicon layer and said silicon-germanium layer.

11. The method of claim 10, wherein said one or more process parameters includes a gas pressure, a RF power, a direct current (DC) power, a HBr flow rate, a He flow rate, a flow rate of said additive gas, or a temperature, or any combination of two or more thereof.

12. The method of claim 1, wherein said substrate rest on a temperature controlled substrate holder in a plasma etching system, said temperature controlled substrate holder comprises:
  a support base having fluid channels to circulate a temperature controlled thermal fluid in said support base; and
  a substrate support coupled via a thermal insulator to an upper portion of said support base, said substrate support comprising:

one or more heating elements embedded within said substrate support, an upper surface to support said substrate by contact between said upper surface and a backside of said substrate, and an electrostatic clamp electrode to hold said substrate on said upper surface of said substrate support.

13. The method of claim 12, wherein said temperature controlled substrate holder further comprises:

a backside gas supply system configured to supply a heat transfer gas to the backside of said substrate through at least one of a plurality of orifices or channels disposed on said upper surface of said substrate support, wherein said plurality of orifices of said backside gas supply system are arranged in a plurality of zones on said upper surface of said substrate support to vary a backside pressure in a radial direction between a substantially central region of the backside of said substrate and a substantially edge region of the backside of said substrate.

14. A method for preparing a silicon-germanium nanowire, comprising:

preparing a film stack on a substrate having alternating layers of silicon (Si) and silicon-germanium (SiGe.sub.x);

transferring a pattern through a silicon (Si) layer in said alternating layers of silicon (Si) and silicon-germanium (SiGe.sub.x) to expose a sidewall of said silicon (Si) layer;

transferring said pattern through a silicon-germanium (SiGe.sub.x) layer in said alternating layers of silicon (Si) and silicon-germanium (SiGe.sub.x) to expose a sidewall of said silicon-germanium (SiGe.sub.x) layer; and laterally etching said sidewall of said silicon (Si) layer by exposing said film stack to a dry plasma etching process having a process composition containing as incipient ingredients HBr and optionally He, wherein said dry plasma etching process achieves an etch selectivity between said silicon (Si) layer and said silicon-germanium (SiGe.sub.x) layer greater than or equal to two.

15. The method of claim 14, wherein said process composition contains HBr and He.

16. The method of claim 14, wherein said process composition consists of HBr and He.

17. The method of claim 14, wherein said transferring said pattern through said silicon (Si) layer and said silicon-germanium (SiGe$_x$) layer creates a fin structure extending between opposing buttress structures located at distal ends of said fin structure.

18. The method of claim 17, wherein said laterally etching said silicon (Si) layer removes said silicon (Si) layer from said fin structure and releases a silicon-germanium (SiGe$_x$) layer bridge.

* * * * *

UNITED STATES PATENT AND TRADEMARK OFFICE
CERTIFICATE OF CORRECTION

PATENT NO. : 8,389,416 B2  Page 1 of 1
APPLICATION NO. : 12/951691
DATED : March 5, 2013
INVENTOR(S) : Vinh H. Luong It is certified that error appears in the above-identified patent and that said Letters Patent is hereby corrected as shown below:

In the Specifications

In Col. 10, line 5, "source, is well known" should read --source, are well known--.

In Col. 10, lines 12-13, "etching system if" should read --etching system 1$f$--.

In Col. 12, line 12, "clamp is well known" should read --clamp are well known--.

In Col. 14, line 44, "present inventors discovered" should read --present inventor discovered--.

In the Claims

In Col. 16, line 11, Claim 1, "(SiGe.sub.x) layer;" should read --(SiGe$_x$) layer;--.

In Col. 16, line 59, Claim 12, "substrate rest" should read --substrate rests--.

In Col. 17, lines 23-24, Claim 14, "(SiGe.sub.x);" should read --(SiGe$_x$);--.

In Col. 17, line 27, Claim 14, "(SiGe.sub.x) to expose" should read --(SiGe$_x$) to expose--.

In Col. 18, line 2, Claim 14, "(SiGe.sub.x) layer" should read --(SiGe$_x$) layer--.

In Col. 18, line 3, Claim 14, "(SiGe.sub.x) to expose" should read --(SiGe$_x$) to expose--.

In Col. 18, line 4, Claim 14, "(SiGe.sub.x) layer;" should read --(SiGe$_x$) layer;--.

In Col. 18, line 12, Claim 14, "(SiGe.sub.x) layer" should read --(SiGe$_x$) layer--.

Signed and Sealed this
Twenty-eighth Day of May, 2013

Teresa Stanek Rea
*Acting Director of the United States Patent and Trademark Office*